(12) United States Patent
Chen et al.

(10) Patent No.: US 6,475,843 B2
(45) Date of Patent: Nov. 5, 2002

(54) POLYSILICON THIN FILM TRANSISTOR WITH A SELF-ALIGNED LDD STRUCTURE

(75) Inventors: Chih-Chiang Chen, I-Lan Hsien (TW); Chih-Hong Chen, Hsinchu Hsien (TW)

(73) Assignee: Industrial Technology Research Institute, Hsinchu (TW)

(*) Notice: Subject to any disclaimer, the term of this patent is extended or adjusted under 35 U.S.C. 154(b) by 0 days.

(21) Appl. No.: 10/084,816

(22) Filed: Feb. 25, 2002

(65) Prior Publication Data

US 2002/0146870 A1 Oct. 10, 2002

Related U.S. Application Data

(62) Division of application No. 09/892,323, filed on Jun. 26, 2001.

(30) Foreign Application Priority Data

Apr. 10, 2001 (TW) ........................................ 90108725 A

(51) Int. Cl.[7] ............................................. H01L 21/336
(52) U.S. Cl. ........................ 438/197; 438/197; 438/585; 438/586
(58) Field of Search ................................. 438/197, 585, 438/586, 591, 653, 643, 687, 592, 595, 596, 666, 674; 257/412, 410, 66, 900, 352, 353, 354

(56) References Cited

U.S. PATENT DOCUMENTS

| | | | | |
|---|---|---|---|---|
| 4,988,632 A | * | 1/1991 | Pfiester | 437/31 |
| 5,087,582 A | * | 2/1992 | Campbell | 437/41 |
| 5,430,320 A | * | 7/1995 | Lee | 257/412 |
| 5,741,722 A | * | 4/1998 | Lee | 437/60 |
| 5,770,498 A | * | 6/1998 | Becker | 438/239 |
| 5,940,698 A | * | 8/1999 | Gardner et al. | 438/197 |
| 6,117,739 A | * | 9/2000 | Gardner et al. | 438/289 |

* cited by examiner

Primary Examiner—Olik Chaudhuri
Assistant Examiner—Laura Schillinger
(74) Attorney, Agent, or Firm—Chien-Wei Chou; Oppenheimer Wolff & Donnelly LLP

(57) ABSTRACT

A polysilicon thin film transistor (poly-Si TFT) with a self-aligned lightly doped drain (LDD) structure has a transparent insulating substrate; a buffering layer formed on the transparent insulating substrate; a polysilicon layer formed on the buffering layer and having a channel region, an LDD structure surrounding the channel region, and a source/drain region surrounding the LDD structure; a gate insulating layer formed on the polysilicon layer; a gate layer formed on the gate insulating layer and positioned over the channel region; an insulating spacer formed on the sidewall of the gate layer and positioned over the LDD structure; and a subgate gate layer formed on the insulating spacer.

11 Claims, 5 Drawing Sheets

POLYSILICON THIN FILM TRANSISTOR WITH A SELF-ALIGNED LDD STRUCTURE

Cross-Reference to Related Application

This application is a divisional of and claims priority to co-pending U.S. patent application Ser. No. 09/892,323, filed Jun. 26, 2001, entitled, "Polysilicon Thin film Transistor With a Self-Aligned LDD Structure".

BACKGROUND OF THE INVENTION

1. Field of the Invention

The present invention relates to a polysilicon thin film transistor (poly-Si TFT) and, more particularly, to a poly-Si TFT with a self-aligned LDD.

2. Description of the Related Art

Polysilicon thin film transistors (poly-Si TFTs) have been widely used in active matrix liquid crystal display (AMLCD) and static random access memory (SRAM) applications. One of the major problems of these TFTs is the OFF-state leakage current, which causes charge loss in LCDs and high standby power dissipation in SRAMs. Seeking to solve this problem, conventional lightly doped drain (LDD) structures have been used to reduce the drain field, thereby reducing the leakage current.

FIGS. 1A and 1B are cross-sectional diagrams showing a conventional method of forming an LDD structure on a poly-Si TFT. As shown in FIG. 1A, a polysilicon. layer 12 is formed on a predetermined surface of a transparent insulating substrate 10, and then a gate insulating layer 14 is formed on the polysilicon layer 12. Next, using a patterned photoresist layer 16 as a mask, a heavy ion implantation process is performed to form a $N^+$ doped region 18 on the polysilicon layer 12, thus the $N^+$ doped region 18 serves as a source/drain region. As shown in FIG. 1B, after removing the patterned photoresist layer 16, a gate layer 20 is patterned on the gate insulating layer 14 to cover a part of the undoped regions of the polysilicon layer 12. Next, using the gate layer 20 as a mask, a light ion implantation process is performed to form a $N^-$ doped region 22 on the undoped region of the polysilicon layer 12. The $N^-$ doped region 22 serves as an LDD structure and the polysilicon layer 12 underlying the gate layer 20 serves as a channel.

However, an extra photo mask is required to expose the photoresist layer 16, thus an error of alignment easily caused by the limitation of the exposure technique may lead to a shift of the LDD structure. In addition, the gate layer 20 is required to achieve a trapezoidal profile to prevent a step-coverage phenomenon from depositing layers on the gate layer 20 in the subsequent processes, thereby the complexity of the process, the production costs and the process time are increased. Also, since the length of the channel is varied from the tapered sidewalls of the gate layer 20, the electric performance of the channel is not reliable.

SUMMARY OF THE INVENTION

The present invention provides a poly-Si TFT with a self-aligned LDD structure to solve problems caused by conventional techniques.

The polysilicon thin film transistor (poly-Si TFT) with a self-aligned lightly doped drain (LDD) structure has a transparent insulating substrate; a buffering layer formed on the transparent insulating substrate; a polysilicon layer formed on the buffering layer and having a channel region, an LDD structure surrounding the channel region, and a source/drain region surrounding the LDD structure; a gate insulating layer formed on the polysilicon layer; a gate layer formed on the gate insulating layer and positioned over the channel region; an insulating spacer formed on the sidewall of the gate layer and positioned over the LDD structure; and a sub-gate layer formed on the insulating spacer.

The present invention also provides a method of forming the polysilicon thin film transistor with a self-aligned lightly doped drain (LDD) structure. First, a transparent insulating substrate is provided with a polysilicon layer formed on the substrate, a gate insulating layer formed on the polysilicon layer, and a gate layer patterned on the gate insulating layer. Then, using a first ion implantation process with the gate layer as a mask, a lightly doped region is formed on the polysilicon layer to surround the gate layer. Next, an insulating layer and a barrier layer are sequentially formed on the entire surface of the substrate. Next, using dry etching to remove parts of the barrier layer, the remaining part of the barrier layer is formed over the sidewall of the gate layer. Next, using wet etching to remove the insulating layer which is not covered by the remaining part of the barrier layer, the remaining part of the insulating layer is formed on the sidewall of the gate layer. Finally, using a second ion implantation process, a heavily doped region is formed on the lightly doped region which is not covered by the remaining parts of the insulating layer and the barrier layer.

Accordingly, it is a principle object of the invention to pattern the self-aligned LDD structure without an extra photo mask.

It is another object of the invention to avoid an error of alignment caused by the limitation of the exposure technique.

Yet another object of the invention is to solve the problems caused by forming the trapezoid profile of the gate layer.

It is a further object of the invention to employ the remaining part of the barrier layer as a metal shielding bump.

Still another object of the invention is to use the poly-Si TFT with the aligned LDD structure in a high frequency operating circuit application.

These and other objects of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

Figure 1A:
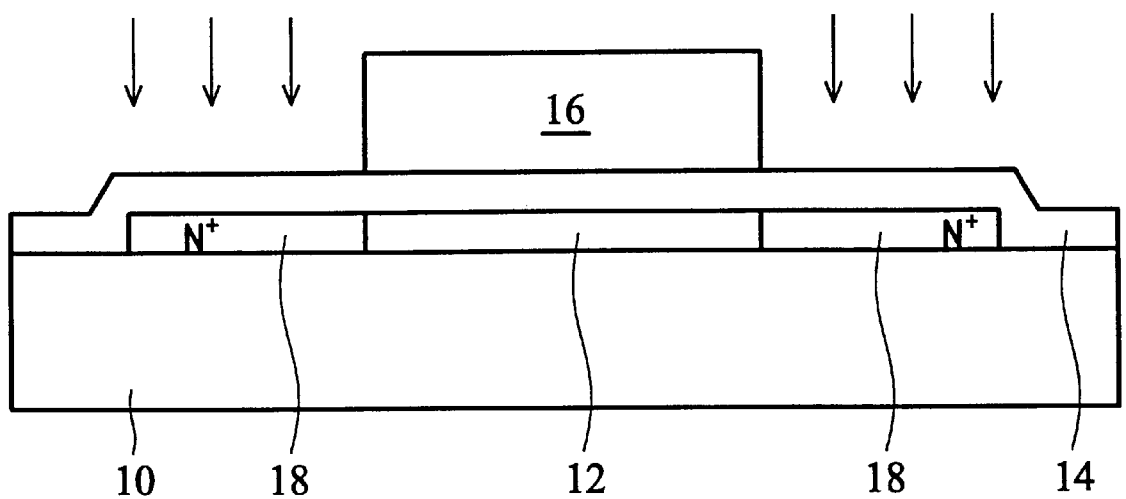
FIGS. 1A and 1B are cross-sectional diagrams showing a conventional method of forming an LDD structure on a poly-Si TFT.
Figure 1B:
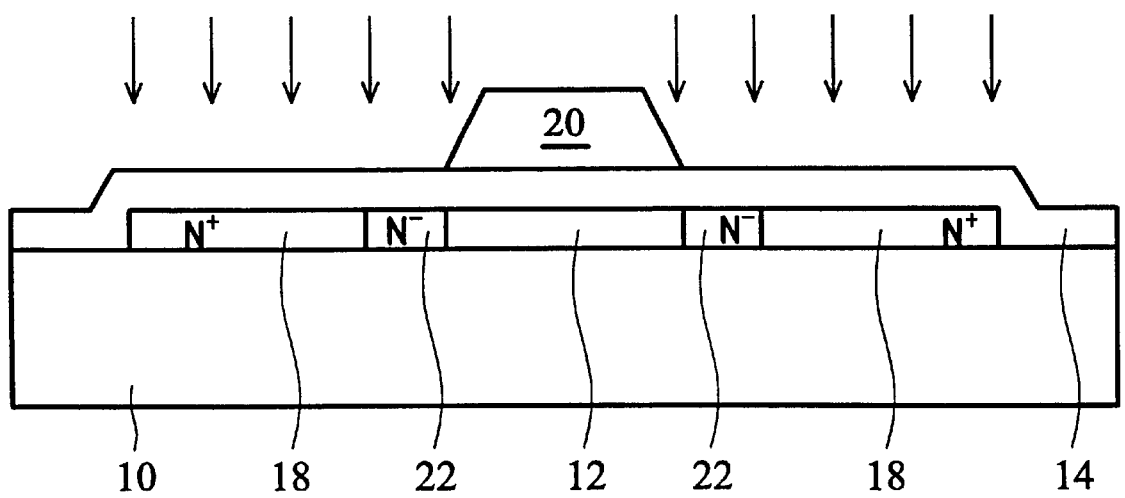
Figure 2A:
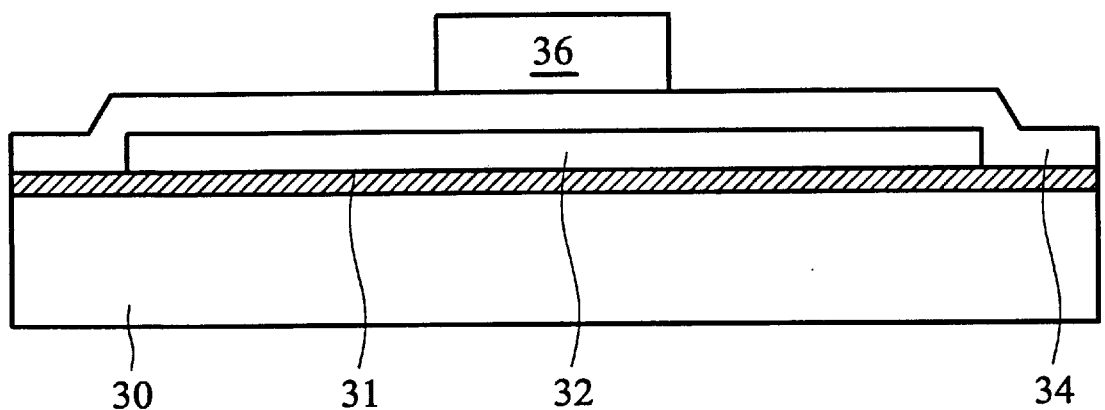
FIGS. 2A to 2G are cross-sectional diagrams showing a method of forming an LDD structure on a poly-Si TFT according to the present invention.

FIGS. 2A to 2G are cross-sectional diagrams showing a method of forming an LDD structure on a poly-Si TFT according to the present invention. As shown in FIG. 2A, a transparent insulating substrate 30 comprises a buffering layer 31 of silicon oxide, a polysilicon layer 32 formed on the buffering layer 31, a gate insulating layer 34 formed on the polysilicon layer 32, and a gate layer 36 patterned on the gate insulating layer 34. It is noted that the gate layer 36 may be formed to have a trapezoid profile or a rectangular profile.

Figure 2B:
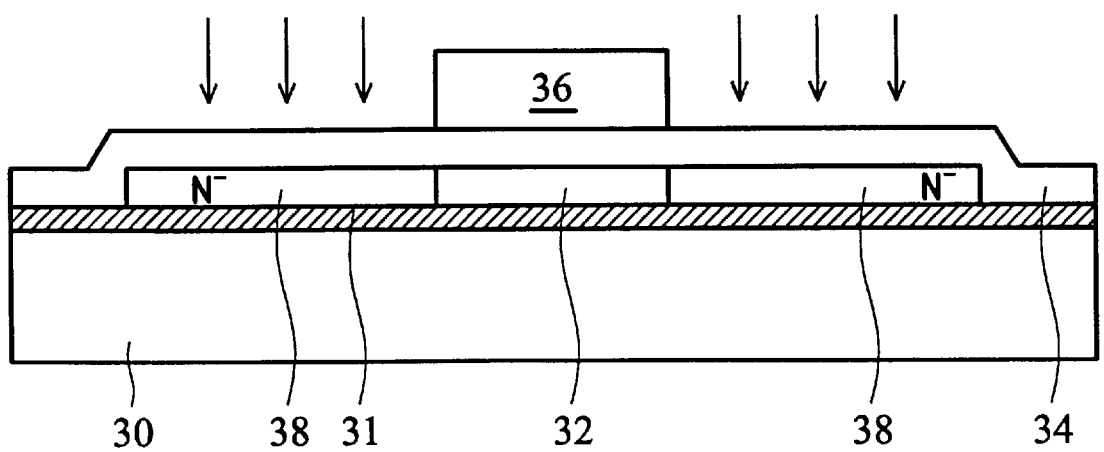
Figure 2C:
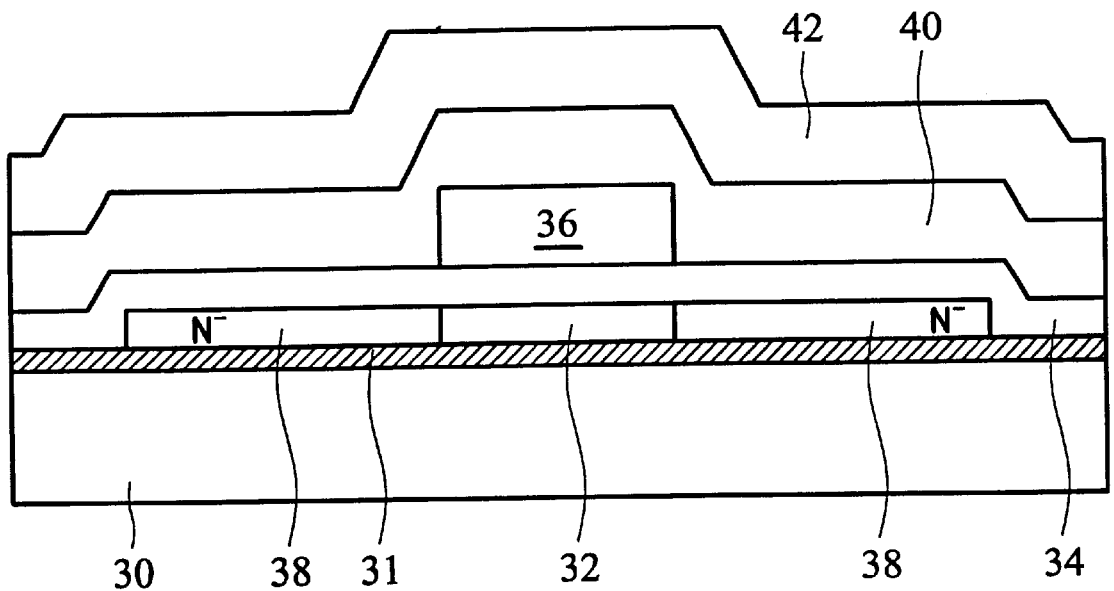

Hereinafter, the method of forming the LDD structure is used in P-MOS poly-Si TFTs applications. As shown in FIG. 2B, using the gate layer 36 as a mask, a light ion implantation process, employing P ions or As ions with a concentration of $1 \times 10^{13} \sim 1 \times 10^{14}$ cm$^{-2}$, is performed to form a N$^-$ doped region 38 on the exposed polysilicon layer 32. Then, as shown in FIG. 2C, an insulating layer 40 and a barrier layer 42 are sequentially deposited on the exposed surface of the substrate 10. The insulating layer 40 may be silicon oxide or silicon nitride, and the barrier layer 42 may be silicon nitride, amorphous silicon or metallic materials.

Figure 2D:
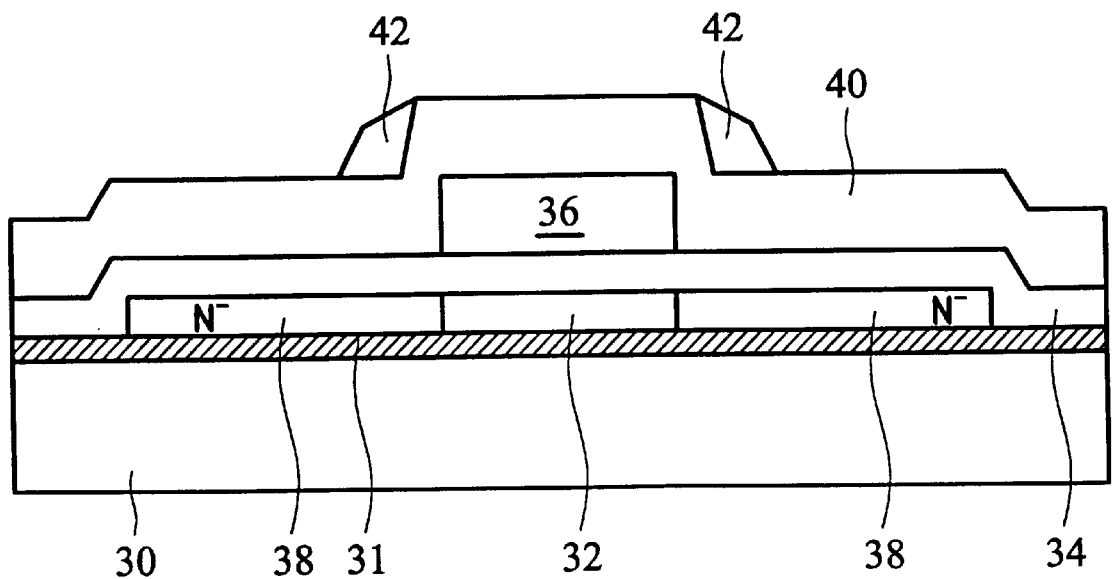
Figure 2E:
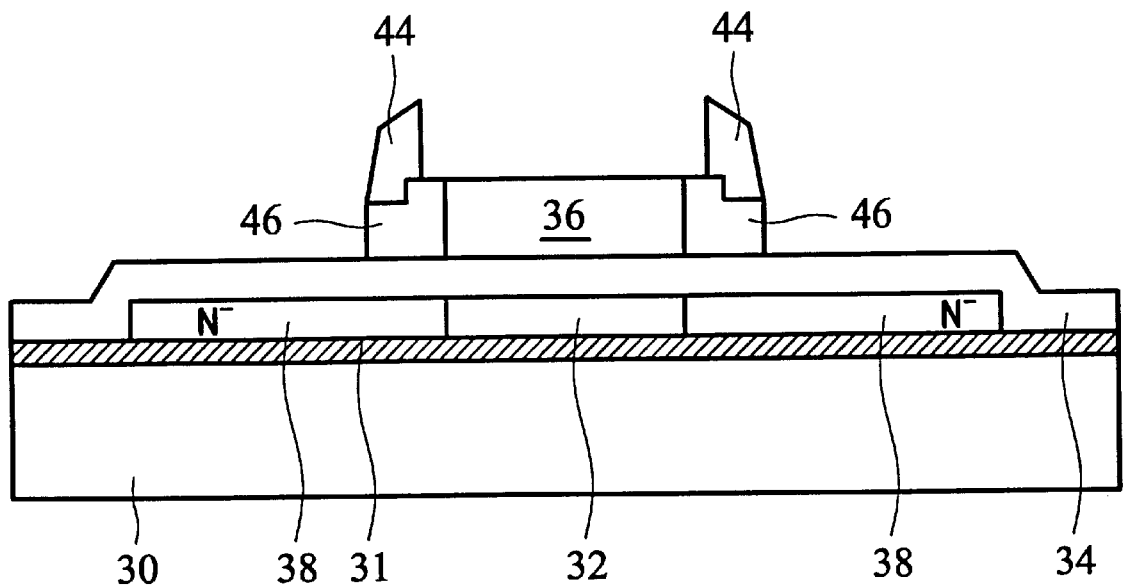
Figure 2F:
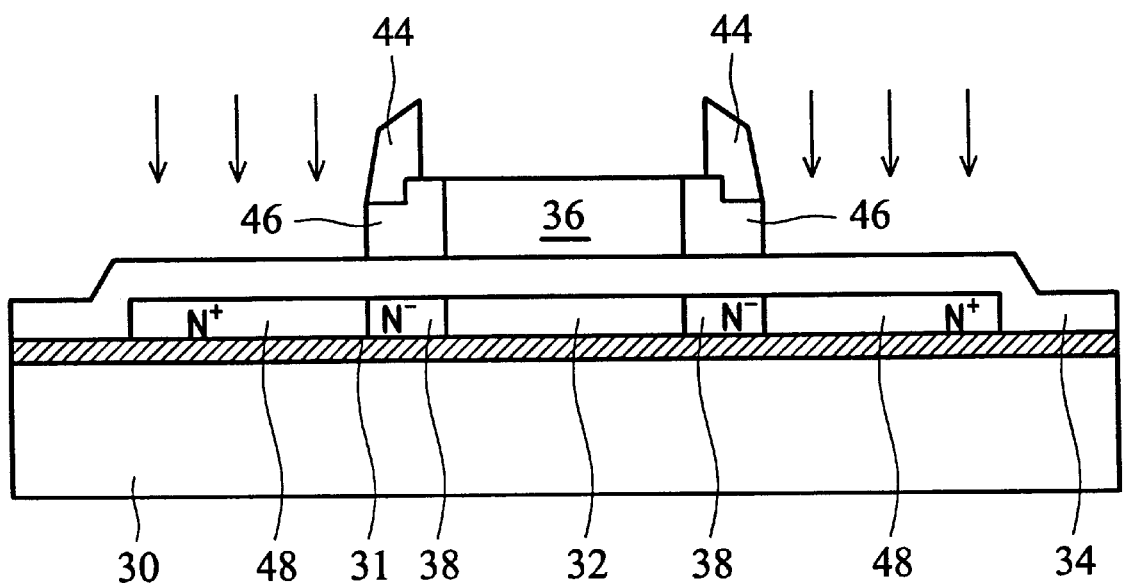

Next, as shown in FIG. 2D, using dry etching to remove part of the barrier layer 42, the barrier layer 42 remains over part of the insulating layer 40 that surrounds the gate layer 36. Next, s shown in FIG. 2E, using wet etching with the barrier layer 42 as a mask, the insulating layer 40 on the gate insulating layer 34 and the top of the gate layer 36 is removed. Thus, the insulating layer 40 remaining on the sidewall of the gate layer 36 serves as a insulating spacer 46, and the barrier layer 42 remaining over the insulating spacer 46 serves as a bump 44. Then, as shown in FIG. 2F, using the gate layer 36, the insulating spacer 46 and the bump 44 as a mask, a heavy ion implantation process, employing P ions or As ions with a concentration of $1 \times 10^{15} \sim 1 \times 10^{16}$ cm$^{-2}$, is performed to form a N$^+$ doped region 48 on the exposed area of the N$^-$ doped region 38. The remaining part of the N$^-$ doped region 38 serves as a self-aligned LDD structure, the N$^+$ doped region 48 serves as a source/drain region, and the undcped region of the polysilicon layer 32 serves as a channel. Besides, if the barrier layer 42 is of amorphous silicon or polysilicon, the heavy ion implantation process can form the bump 44 into a semiconductor gate layer.

Figure 2G:
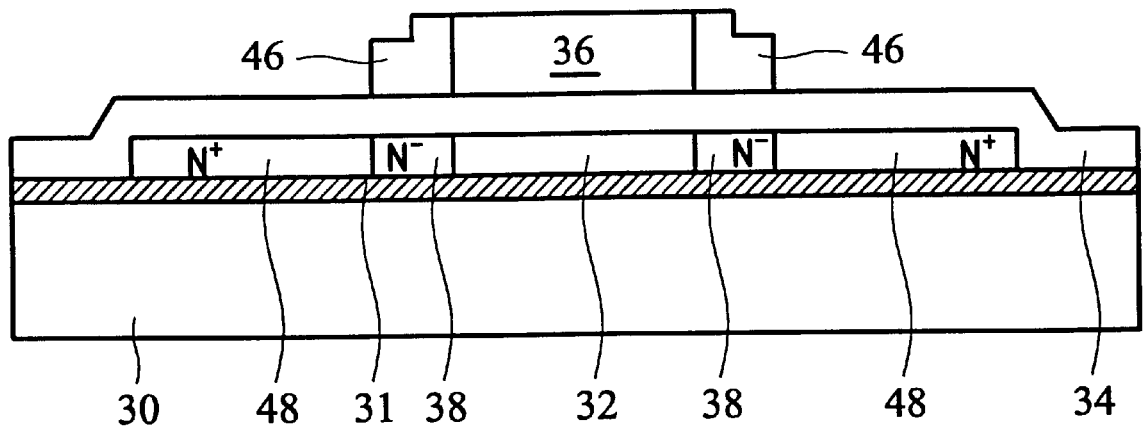

Finally, depending on the requirements of process control and product performance, the bump 44 can be removed or left. When the bump 44 is removed, a poly-Si TFT with the LDD structure is completed as shown in FIG. 2G. When the bump 44 is of conductive materials, such as metallic materials or doped polysilicon, the bump 44 can be left over the insulating spacer 46 (shown in FIG. 2F) to serve as a sub-gate layer. The sub-gate layer covers the self-aligned LDD structure to provide a metal shielding effect, thus the vertical electric field between the gate layer 36 and drain in decreased. This can be used in a high frequency operating circuit application. Compared with the method of forming an LDD structure in the prior art, the present invention employs the barrier layer 42 to pattern the self-aligned LDD structure without an extra photo mask, thus an error of alignment caused by the limitation of the exposure technique is avoided. In addition, irrespective of whether the gate layer 36 is formed to be rectangular or trapezoidal, the problems caused by formation of the trapezoidal profile are solved. Furthermore, the bump 44 provides a metal shielding effect, thereby the poly-Si TFT with the aligned LDD structure can be used in a high frequency operating circuit application.

It is to be understood that the present invention is not limited to the embodiments described above, but encompasses any and all embodiments within the scope of the following claims.

What is claimed is:

1. A method of forming a polysilicon thin film transistor with a self-aligned lightly doped drain (LDD) structure, comprising steps of:

providing a transparent insulating substrate, which has a polysilicon layer, a gate insulating layer formed on the polysilicon layer, and a gate layer patterned on the gate insulating layer;

performing a first ion implantation process to form a lightly doped region on the polysilicon layer surrounding the gate layer;

forming an insulating layer and a barrier layer sequentially on the entire surface of the substrate; removing parts of the barrier layer, wherein the remaining part of the barrier layer is positioned over the sidewall of the gate layer;

removing the insulating layer which is not covered by the remaining part of the barrier layer, wherein the remaining part of the insulating layer is positioned on the sidewall of the gate layer; and performing a second ion implantation process to form a heavily doped region on the lightly doped region which is not covered by the remaining parts of the insulating layer and the barrier layer.

2. The method according to claim 1, further comprising a step of: completely removing the remaining part of the barrier layer.

3. The method according to claim 1, wherein the transparent insulating substrate is glass.

4. The method according to claim 1, wherein the combination of the gate layer and the remaining part of the insulating layer presents a rectangular profile.

5. The method according to claim 1, wherein the gate layer is of conductive materials.

6. The method according to claim 1, wherein the insulating layer is silicon nitride or silicon oxide.

7. The method according to claim 1, wherein the barrier layer is silicon nitride.

8. The method according to claim 1, wherein the barrier layer is amorphous silicon or polysilicon.

9. The method according to claim 1, wherein the barrier layer is of conductive materials.

10. The method according to claim 1, wherein the step of removing parts of the barrier layer is formed by dry etching.

11. The method according to claim 1, wherein the step of removing the insulating layer covered by the remaining part of the barrier layer is formed by wet etching.

* * * * *